United States Patent
Kurita et al.

(10) Patent No.: US 7,370,786 B2
(45) Date of Patent: May 13, 2008

(54) BONDING METHOD AND BONDING APPARATUS

(75) Inventors: Yoichiro Kurita, Kanagawa (JP); Jun Nogawa, Kanagawa (JP); Masato Maeda, Kanagawa (JP); Teruji Inomata, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 480 days.

(21) Appl. No.: 11/181,861

(22) Filed: Jul. 15, 2005

(65) Prior Publication Data
US 2006/0011706 A1 Jan. 19, 2006

Related U.S. Application Data

(62) Division of application No. 10/626,522, filed on Jul. 25, 2003, now Pat. No. 6,932,262.

(30) Foreign Application Priority Data
Jul. 25, 2002 (JP) .............................. 2002-216941

(51) Int. Cl.
*B23K 1/06* (2006.01)
(52) U.S. Cl. ..................... 228/110.1; 228/113; 156/64; 156/358; 156/580.2; 310/323.18; 700/301
(58) Field of Classification Search ............. 228/110.1, 228/113; 156/64, 358, 580.2; 310/323.18; 700/301
See application file for complete search history.

(56) References Cited
U.S. PATENT DOCUMENTS

| | | | |
|---|---|---|---|
| 5,454,506 A | 10/1995 | Jordhamo et al. | |
| 5,820,011 A * | 10/1998 | Ito et al. | 228/1.1 |
| 5,884,835 A * | 3/1999 | Kajiwara et al. | 228/110.1 |
| 5,921,460 A | 7/1999 | Topping et al. | |
| 6,010,059 A | 1/2000 | Newland | |
| 6,202,915 B1 * | 3/2001 | Sato | 228/110.1 |
| 6,609,648 B2 | 8/2003 | Kondo | |
| 6,619,532 B2 * | 9/2003 | Hembree et al. | 228/103 |
| 6,662,992 B2 | 12/2003 | Betrabet et al. | |

FOREIGN PATENT DOCUMENTS

JP 2002-164384 A 6/2002

* cited by examiner

*Primary Examiner*—Sam Chuan C. Yao
*Assistant Examiner*—Erin P Barry
(74) *Attorney, Agent, or Firm*—Sughrue Mion, PLLC

(57) ABSTRACT

Disclosed are a bonding method for a semiconductor chip, which employs an ultrasonic bonding scheme that prevents wear-out of the top surface of a mount tool and ensures both high reliability and high productivity, and a bonding apparatus which is used to carry out the method. The bonding apparatus and method are provided with means for suppressing generation of a sliding friction. The apparatus and method execute a bonding process by controlling vibration-axial directional holding force and inertial force based on information given from control management means to thereby maintain a relationship of (vibration-axial directional holding force)>(die shear strength)+(inertial force)

while applying an ultrasonic vibration to a region which is subjected to bonding.

9 Claims, 5 Drawing Sheets

BONDING METHOD AND BONDING APPARATUS

This is a divisional of application Ser. No. 10/626,522 filed Jul. 25, 2003 now U.S. Pat. No. 6,932,262. The entire disclosure of the prior application, application Ser. No. 10/626,522 is hereby incorporated by reference.

BACKGROUND OF THE INVENTION

1. Field of the Invention

The present invention relates to a method of manufacturing a semiconductor chip package which is acquired by connecting a semiconductor chip to another semiconductor chip or a substrate, and a manufacturing apparatus which is used in manufacturing the semiconductor chip package, and, more particularly, to a bonding apparatus which employs an ultrasonic bonding scheme and a manufacturing apparatus which is used to manufacture the semiconductor chip package.

2. Description of the Related Art

Recently, information communication systems in information communication networks which are expanding rapidly and globally demand enhanced capabilities and faster speed. In the packaging technology for semiconductor chips, high integration packaging techniques have been developed to meet the demand. As high integration packaging techniques which improve the performance of electronic devices make simultaneous bonding at multiple bonding points, it is important to achieve both the reliability and productivity.

Semiconductor chip packaging using an ultrasonic bonding technique is a promising technique to meet the requirements. Ultrasonic bonding is a technique which allows the to-be-bonded metal surface of a chip to contact the to-be-bonded metal surface of a mating part and applies ultrasonic vibration in a direction parallel to the contact surfaces to bond both. The ultrasonic bonding can bond metals in a shorter time in principle than other schemes.

Because of the advantage, studies have been made on the adaptation of this bonding scheme to bonding techniques, such as flip-chip bonding, face-down bonding and simultaneous bonding, as well as wire bonding, and practical usage of such adaptation for small chips is in progress. Adaptation to large chips, however, has not progressed yet so far. This is because as the number of pins to be bonded increases with an increase in the chip size, the input energy necessary for bonding increases, bringing about a serious problem of the wear-out of the mount tool which would not matter so much for small chips.

The wear-out of the mount tool will be discussed referring to the conceptual diagram of a semiconductor chip bonding apparatus using ultrasonic bonding shown in FIG. 1.

The mount tool has a capability of transferring an ultrasonic wave from ultrasonic vibration generating means to a to-be-bonded region via a semiconductor chip to be bonded while keeping applying holding force perpendicular to the contact surface to the semiconductor chip, and is a very important component for the ultrasonic bonding apparatus.

A semiconductor chip 12 is held by a mount tool 11 and another part 15 to be bonded to the semiconductor chip 12 is secured onto a stage 16 in a bonding process to such a degree that the part 15 does not cause friction with respect to the stage 16. With both bonding portions (13 and 14 in FIG. 1) in contact with each other, ultrasonic vibration is started. In general, at least one of the bonding portions 13 and 14 is a bump having such a structure as to protrude like a projection from the part, and the other part is the bump or a pad which is placed in a plate shape on a part.

When the area of a bonding region 17, a region where the bonding portions 13 and 14 are effectively coupled, increases as the bonding process progresses, sliding friction may occur at the interface between the mount tool 11 and the semiconductor chip 12. If ultrasonic vibration continues in this state, wear-out may occur on both the mount tool 11, which is kept applied with friction, and the semiconductor chip 12 at the contact surface thereof or a tool/chip contact surface 18. When such a situation is repeated, the wear-out of the mount tool 11 may go further in which case there is a possibility of causing improper bonding or causing a serious hindrance, such as damaging a part to be machined so that the replacement of the mount tool 11 is essential. At present, the replace period is short, which stands in the way of improving the productivity.

Many inventions have been presented so far to overcome the problem. A typical invention is disclosed in Japanese Patent Laid-Open No. 2002-164384 which is characterized by reducing the wear amount by specifying the material for the top surface of the mount tool.

However, such an invention is a symptomatic invention which cannot essentially prevent wearing and is not an essential solution to improvement of the productivity and reliability while it can make the replace period of the mount tool longer a little.

SUMMARY OF THE INVENTION

It is an object of the invention to provide a bonding method for a semiconductor chip, which employs an ultrasonic bonding scheme that prevents wear-out of the top surface of a mount tool and ensures both high reliability and high productivity, and a bonding apparatus which is used to carry out the method.

In solving the problems, the present inventor deeply looked at friction during ultrasonic processing based on the technical concept such that wearing of the top surface of the mount tool 11 can be prevented by suppressing friction between the mount tool 11 and the semiconductor chip 12.

The present inventor came up ideas (1) that the movement of the friction surface is involved in causing wear-out at the tool/chip contact surface 18 (see FIG. 1) of the mount tool 11 and (2) that the inertial force originated from ultrasonic vibration works as external force to cause friction on the contact surface of the mount tool 11 and the semiconductor chip 12.

To begin with, the first idea will be discussed.

The sliding friction does not occur at the tool/chip contact surface 18 from the beginning of the ultrasonic bonding process, but occurs at the bonding region 17 at the beginning. This friction becomes the energy source to enlarge the bonding region 17. Because, under the situation, the vibration-axial directional holding force which is the shear strength of the tool/chip contact surface is greater than the die shear strength or the entire shear strength of the bonding region 17, the ultrasonic-vibration oriented force needed for the reciprocal movement becomes the die shear strength.

As the bonding process progresses and the area of the bonding region 17 increases, however, the die shear strength increases, making larger the ultrasonic-vibration oriented force needed for the reciprocal movement. During ultrasonic vibration, this force works as force that always tends to generate friction on the tool/chip contact surface 18. As the bonding process progresses further so that the die shear strength matches with the vibration-axial directional holding force, the sliding friction surface is shifted from the bonding region 17 to the tool/chip contact surface 18.

FIG. 2 is a graph showing the above relationship. In the diagram, the vertical scale represents the shear strength in the vibration-axial direction at each contact surface. The comparison of a line 21 showing the die shear strength and a line 22 showing the vibration-axial directional holding force or the shear strength of the tool/chip contact surface 18 shows that sliding friction occurs at a lower contact portion. Although friction at the bonding region 17 occurs by priority in the initial stage of the process, the die shear strength and the vibration-axial directional holding force become approximately equal to each other in the vicinity of a point 23. At any point following the point 23, friction at the tool/chip contact surface 18 occurs by priority and part of the input energy of the ultrasonic vibration is consumed by sliding friction at this interface. As the process energy input becomes smaller, an increase in die shear strength becomes gentler and this energy becomes a direct factor to bring about wear-out.

The first idea leads to that the suppression of the movement of the friction surface, if achieved, can restrain the wear-out of the tool surface considerably. It is apparent from FIG. 2 that the suppression of the movement of the friction surface can be realized by always keeping the vibration-axial directional holding force higher than the die shear strength while ultrasonic vibration is being applied.

Next, the second idea will be discussed.

During the bonding process, as mentioned above, the die shear strength acts on the semiconductor chip 12 as the force to separate the semiconductor chip 12. In addition to this force, however, inertial force that is generated with respect to when the vibration direction is reversed acts as external force.

Therefore, the condition for the vibration-axial directional holding force needed to suppress the movement of the friction surface is (vibration-axial directional holding force)>(die shear strength)+(inertial force).

The invention has been made based on those ideas. To achieve the objects, a bonding apparatus for a semiconductor chip according to the first aspect of the invention comprises:

ultrasonic vibration generating unit which applies an ultrasonic vibration to a contact region where a bonding portion of said semiconductor chip is in contact with a bonding portion of another part to be bonded to said semiconductor chip, via a mount tool for holding said semiconductor chip, so that said ultrasonic vibration increases a die shear strength that is a shear strength of an entire bonding region to be formed between said semiconductor chip and said part which are to be bonded in an ultrasonic-vibration-axial direction;

holding force control unit which controls vibration-axial directional holding force or a shear strength of an entire contact interface of said semiconductor chip to be held by said mount tool and said mount tool in said ultrasonic-vibration-axial direction;

inertial force control unit which controls inertial force in said ultrasonic-vibration-axial direction, which is generated on said semiconductor chip to be held by said mount tool by said ultrasonic vibration; and control management unit which maintains a relationship of (vibration-axial directional holding force)>(die shear strength)+(inertial force).

While the conditional equation for suppressing the occurrence of the sliding friction at the tool/chip contact surface 18 is included as a management item in the control management unit of the bonding apparatus according to the first aspect of the invention, the die shear strength in the equation is obtained as a result of bonding and does not thus become a control value so that other factors should be controlled. Because the first aspect of the invention has unit controls the vibration-axial directional holding force and the inertial force, the vibration-axial directional holding force can be kept higher than the sum of the die shear strength and the inertial force even in a state where the die shear strength is increased due to ultrasonic vibration applied. It is therefore possible to suppress the occurrence of sliding friction at the tool/chip contact surface, thus ensuring prevention of wear-out of the side that includes the tool/chip contact surface 18.

In the bonding apparatus, the holding force control unit may comprise at least one of unit which applies a vertical load from the mount tool to a contact surface of the mount tool with the semiconductor chip to be held by the mount tool and chuck unit, installed inside the mount tool, which chucks the semiconductor chip to be held by the mount tool.

According to the structure, part of the vibration-axial directional holding force is given by multiplying the sum of the vertical load force to the tool/chip contact surface from the mount tool 11 and the chuck force of the semiconductor chip 12 by the frictional coefficient of the tool/chip contact surface 18. Because the vibration-axial directional holding force is in accordance with the clear physical law, the vibration-axial directional holding force can be controlled easily and accurately. This can improve the control reliability at the time of satisfying the condition for the suppression of the occurrence of sliding friction at the tool/chip contact surface 18.

In the bonding apparatus, the inertial force control unit may comprise at least one of unit which changes a vibration frequency of the ultrasonic vibration and which changes a vibration amplitude of the ultrasonic vibration.

The inertial force originated from ultrasonic vibration is given by the semiconductor chip 12, the vibration amplitude and the vibration frequency. This structure can control at least one of the amplitude and frequency. Accordingly, the inertial force can be controlled directly, which can improve the control reliability at the time of satisfying the condition for the suppression of the occurrence of sliding friction at the tool/chip contact surface 18.

In the bonding apparatus, the control management unit may include a memory device where data about a variation in the die shear strength stored beforehand is saved.

With this structure, as information on a variation in the die shear strength is stored in the memory device beforehand, the control method for the vibration-axial directional holding force and the inertial force can be set previously. Accordingly, the control time delay is difficult to occur at the time of controlling those forces to meet the aforementioned conditional equation given as a management item. This can result in an improvement of the control reliability in satisfying the condition for the suppression of the occurrence of sliding friction at the tool/chip contact surface 18.

In the bonding apparatus, the control management unit may include unit measuring the die shear strength or a substitute characteristic thereof.

In this case, information on a variation in the die shear strength can be acquired for each bonding process. This can allow the vibration-axial directional holding force and the inertial force to be controlled with high accuracy and can thus improve the control reliability in satisfying the condition for the suppression of the occurrence of sliding friction at the tool/chip contact surface 18.

In the bonding apparatus, the control management unit may include unit measuring the vibration-axial directional holding force or a substitute characteristic thereof.

With the structure, information on the actual control value for the vibration-axial directional holding force to be controlled can be acquired for each bonding process. This can ensure high-precision control of the vibration-axial directional holding force and can thus improve the control reliability in satisfying the condition for the suppression of the occurrence of sliding friction at the tool/chip contact surface 18.

To achieve the objects, a bonding method for a semiconductor chip according to the second aspect of the invention comprises the steps of:

applying an ultrasonic vibration to a contact region where a bonding portion of the semiconductor chip is in contact with a bonding portion of part to be bonded to the semiconductor chip, via a mount tool for holding the semiconductor chip; and controlling vibration-axial directional holding force, which is a shear strength of an entire contact interface of the semiconductor chip to be held by the mount tool and the mount tool in an ultrasonic-vibration-axial direction, and inertial force in the ultrasonic-vibtation-axial direction, which is generated on the semiconductor chip to be held by the mount tool by the ultrasonic vibration, thereby maintaining a relationship of (vibration-axial directional holding force)>(die shear strength)+(inertial force).

According to the bonding method, the vibration-axial directional holding force can be kept higher than the sum of the die shear strength and the inertial force by controlling the vibration-axial directional holding force and the inertial force to satisfy the conditional equation even in a state where the area of the bonding region is increased by the application of ultrasonic vibration, thereby increasing the die shear strength. It is therefore possible to suppress the occurrence of sliding friction at the tool/chip contact surface, thus ensuring prevention of wear-out of the side including the tool/chip contact surface 18.

This bonding method may further include the steps of reducing the ultrasonic vibration to such an amplitude that immediately before stopping the ultrasonic vibration, the ultrasonic vibration can be absorbed with plastic deformation of at least one of the bonding portions of those two parts which are to be bonded.

As the method includes a step of reducing the ultrasonic vibration to such an amplitude that immediately before the bonding process, ultrasonic vibration can be absorbed with plastic deformation of the bonding region, it is possible to set the condition for not to cause sliding friction at the region to be bonded. This can suppress the occurrence of sliding friction at the tool/chip contact surface while prevent the occurrence of improper bonding in the bonding region and can prevent wear-out of the surface including the tool/chip contact surface 18 of the mount tool 11 while improving the bonding reliability.

The bonding method may further include the steps of:

designing a structure of at least one of the bonding portions of those two parts which are to be bonded into a so-called stud bump whose distal end has a protruding shape;

making the bonding portions of the two parts to be bonded contact with each other; and causing plastic deformation of at least one of projections at distal ends of the stud bump to thereby increase an area of contact.

This structure can provide contact regions to be bonded by the application of ultrasonic vibration with a high reproducibility and can enhance the reproducibility of a variation profile which is a time-dependent variation in die shear strength after ultrasonic vibration has started. Even in a case where the control is executed with the control methods for the vibration-axial directional holding force and the inertial force defined without measuring the variation profile for each bonding process, therefore, it is possible to improve the control reliability in satisfying the condition for the suppression of the occurrence of sliding friction at the tool/chip contact surface 18.

In the bonding method, at least one of the bonding portions of those two parts which are to be bonded may be heated in at least a part, and desirably all, of a time over which the ultrasonic vibration is applied.

Heating makes it easier to cause plastic deformation of one of the two bonding portions, the die shear strength is decreased. By heating at least one of the bonding portions, it is possible to increase the degree of freedom of the control at the time of satisfying the condition for the suppression of the occurrence of sliding friction at the tool/chip contact surface 18.

In any one of the bonding method according to the second aspect of the invention and the modifications thereof, the structure of the bonding portion of the semiconductor chip to be held by the mount tool may be a bump having at least one of gold, aluminum and copper as a material for a topmost surface, and the another part to be bonded to said semiconductor chip may be a wiring board which has a pad having at least one of gold, aluminum and copper as a material for a topmost surface.

In any one of the bonding method according to the second aspect of the invention and the modifications thereof, the structure of the bonding portion of the semiconductor chip to be held by the mount tool may be a pad having at least one of gold, aluminum and copper as a material for a topmost surface, and the another part to be bonded to said semiconductor chip may be a wiring board the structure of whose bonding portion has at least one of gold, aluminum and copper as a material for a topmost surface.

In any one of the bonding method according to the second aspect of the invention and the modifications thereof, the structure of the bonding portion of the semiconductor chip to be held by the mount tool may be a pad having at least one of gold, aluminum and copper as a material for a topmost surface, and the another part to be bonded may be a semiconductor chip which has, as the structure of the bonding portion, a bump having at least one of gold, aluminum and copper as a material for a topmost surface, or a part including that semiconductor chip as a structural element.

In any one of the bonding method according to the second aspect of the invention and the modifications thereof, the structure of the bonding portion of the semiconductor chip to be held by the mount tool may be a bump having at least one of gold, aluminum and copper as a material for a topmost surface, and the another part to be bonded may be a semiconductor chip which has a pad having at least one of gold, aluminum and copper as a material for a topmost surface, or a part including that semiconductor chip as a structural element.

In any one of the bonding method according to the second aspect of the invention and the modifications thereof, the structure of the bonding portion of the semiconductor chip to be held by the mount tool may be a bump having at least one of gold, aluminum and copper as a material for a topmost surface, and the another part to be bonded to said semiconductor chip may be another semiconductor chip which has a bump having at least one of gold, aluminum and copper as a material for a topmost surface, or a part including that semiconductor chip as a structural element.

As the bonding method according to the second aspect of the invention and the three modifications thereof can suppress the occurrence of sliding friction at the tool/chip contact surface 18 without particularly restricting the semiconductor chip or another part to undergo a bonding process, the invention can be adapted in the form of various combinations as given in the last four modifications. It is therefore possible to provide a bonding method which satisfies both a high reliability and high productivity in processing parts of multiple combinations.

DETAILED DESCRIPTION OF THE PREFERRED EMBODIMENTS

Now, preferred embodiments of the present invention will be described below with reference to the accompanying drawings. The embodiments are to be considered as illustrative and not restrictive and the present invention is not to be limited to the details given herein, but may be modified within the scope of the appended claims.

Figure 1:
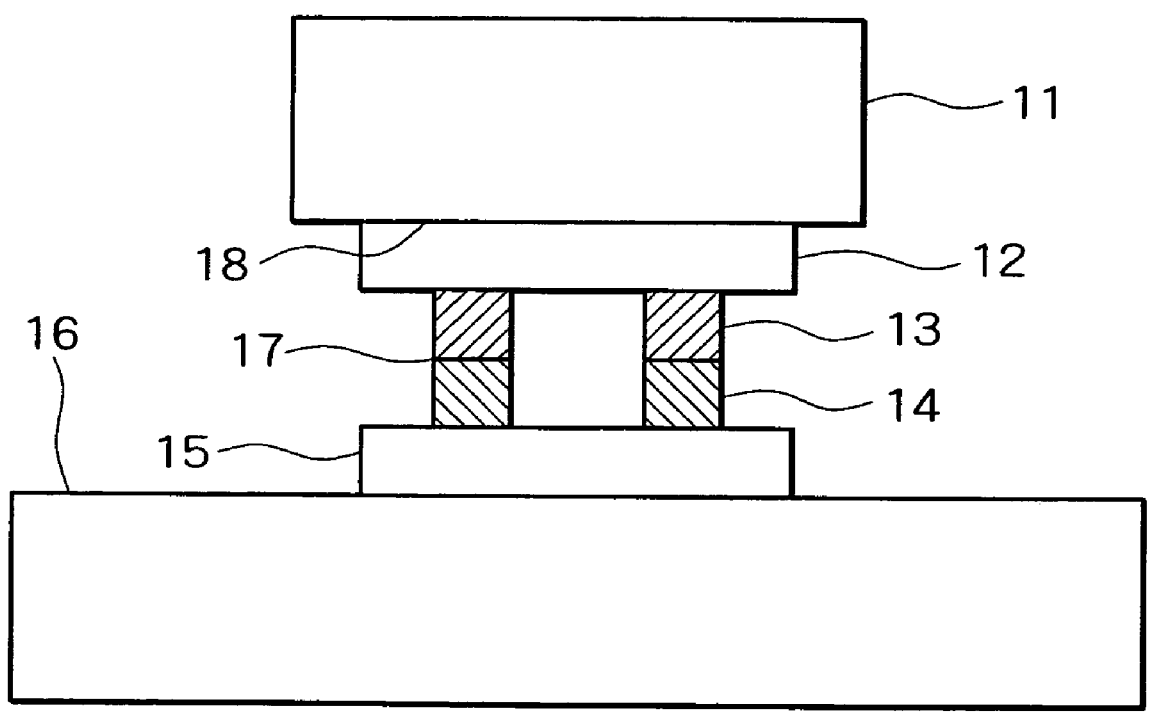
FIG. 1 is a conceptual diagram of a semiconductor chip bonding method using ultrasonic bonding.
Figure 2:
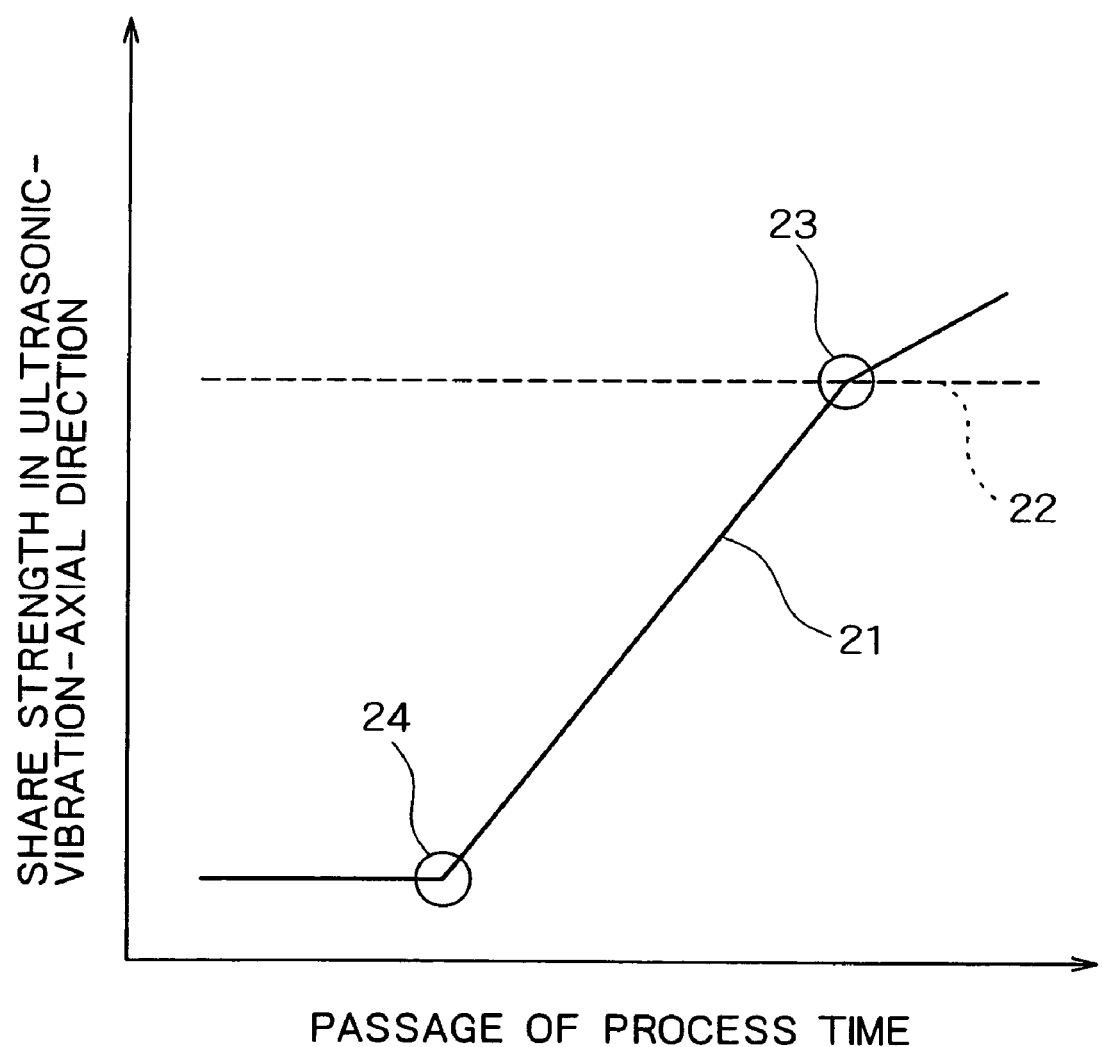
FIG. 2 is a graph showing time-dependent changes in die shear strength and vibration-axial directional holding force during a bonding process.
Figure 3:
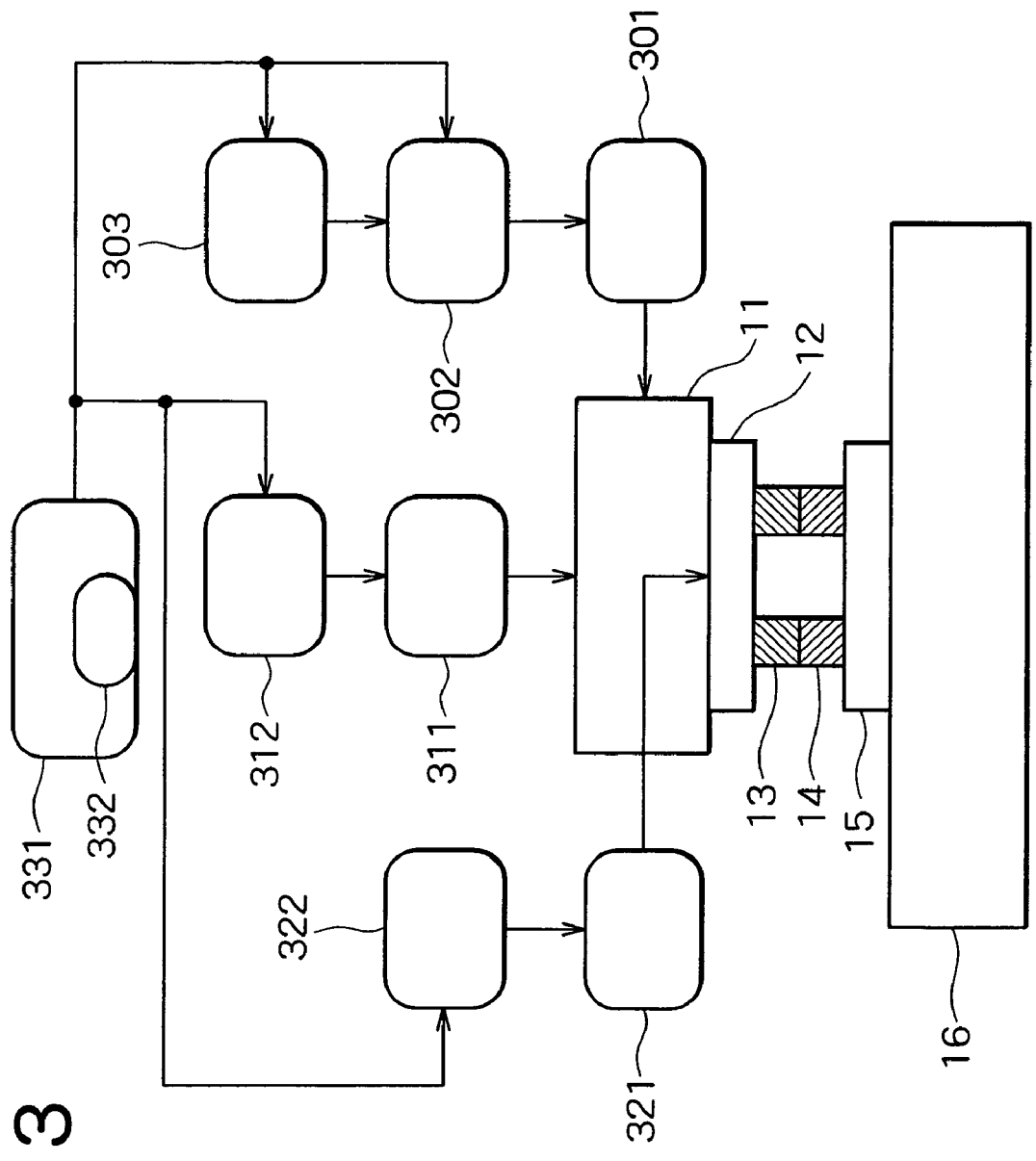
FIG. 3 is a conceptual diagram of a bonding apparatus according to one embodiment of the invention.

FIG. 3 is a conceptual diagram of a bonding apparatus according to one embodiment of the invention. The bonding apparatus has a basic structure similar to that of the ultrasonic bonding method in FIG. 1, and added as control unit for the vibration-axial directional holding force are an ultrasonic vibration generating section 301, a vibration amplitude control section 302, a vibration frequency control section 303, a vertical load section 311 and a load force control section 312 both associated with a load to a mount tool 11, a chuck section 321 and a chuck force control section 322 both associated with chucking of a semiconductor chip 12, a control management section 331 which gives control values to the aforementioned individual control sections, and a memory section 332 which stores information on a variation in die shear strength.

When the bonding apparatus according to the embodiment is performing ultrasonic bonding, the control management section 331 gives control information to the vibration amplitude control section 302, the vibration frequency control section 303, the load force control section 312 and the chuck force control section 322 based on the information from the memory section 332 to keep the relationship of (vibration-axis directional holding force)>(die shear strength)+(inertial force).

The individual control sections controls the ultrasonic vibration generating section 301, the vertical load section 311 and the chuck section 321 based on the control information received. As a result, at least one of the ultrasonic vibration amplitude, the ultrasonic vibration frequency, the vertical load and the chuck force changes with time so that the conditional equation is satisfied during the bonding process.

The embodiment will now be discussed more specifically. To make the control in the embodiment clear, the control factors in the condition equation will be shifted to the left-hand side of the equation as follows.

(vibration-axis directional holding force)−(inertial force)>(die shear strength)

The vibration-axial directional holding force is given by the relationship of

{(vertical load)+(chuck force)}×(frictional coefficient)

and the inertial force is given by (mass of semiconductor chip 12)×(vibration amplitude)×(vibration angular frequency)$^2$.

The frictional coefficient is a system characteristic value which is greatly influenced by the frictional material and the mass of the semiconductor chip 12 is an uncontrollable factor in each bonding process. Those two factors are therefore eliminated as control factors in the invention. Accordingly, the remaining four factors are used as control targets in this embodiment.

In controlling the four factors in the embodiment, the profile of the die shear strength variation during the bonding process is empirically measured, a control method for each factor is determined beforehand based on the measurements, and the information is saved in the memory section 332 which is included as part of the control management section 331. After the bonding process starts, the control management section 331 accesses the memory section 332 to acquire the control method and controls each factor to keep the conditional equation. As the control method is provided before the bonding process, a control delay can be minimized.

The information that is stored in the memory section 332 is not limited to the result of a bonding experiment but various kinds of associated information can be stored in the memory section 332. For example, information which is obtained in the bonding process performed before the previous one may be stored, and in case where the control value of each control factor varies as a result of repetition of the bonding process, information on that variation may be stored.

The control described above can keep the effective vibration-axial directional holding force, which is the inertial force subtracted from the vibration-axial directional holding force, greater than the die shear strength and can suppress the occurrence of sliding friction between the mount tool 11 and the semiconductor chip 12 through the bonding process. Therefore, the bonding apparatus of the embodiment can prevent wear-out of the mount tool 11, thus making it possible to reduce the frequency of replacement of the mount tool 11 as compared with the prior art. The embodiment can therefore significantly improve the productivity as compared with the prior art. Further, the prevention of wearing of the mount tool 11 prevents the semiconductor chip 12 from being incompletely held to the mount tool 11. This improves the reliability of the bonding step and can eliminate the mount position checking step prior to the bonding, which was required by the conventional fabrication method. Furthermore, the prevention of wearing of the mount tool 11 suppresses the occurrence of damages on the semiconductor chip 12 originated from the deteriorated surface shape of the mount tool 11 that comes in contact with the semiconductor chip 12.

Figure 4:
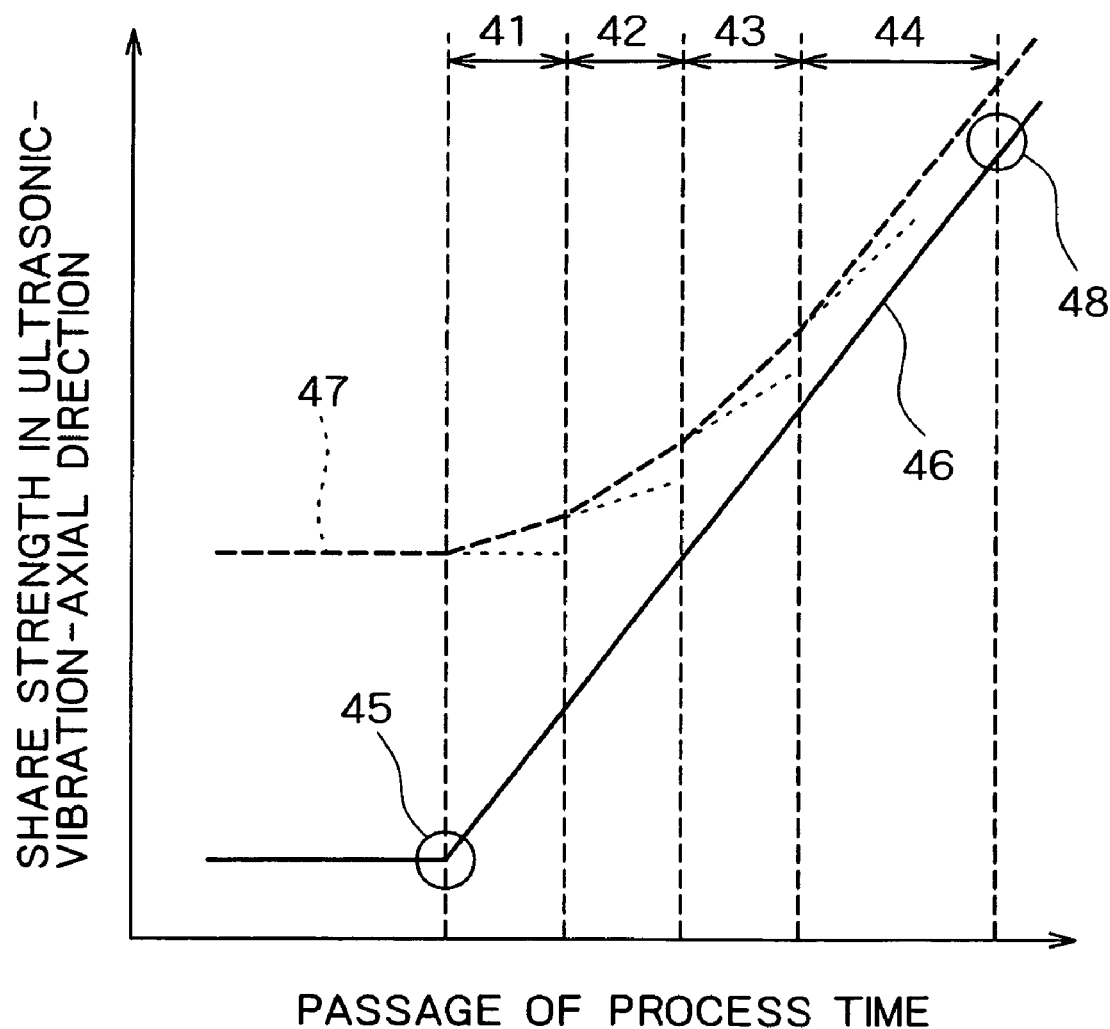
FIG. 4 is a graph showing time-dependent changes in die shear strength and effective vibration-axial directional holding force during a bonding process according to the embodiment.

FIG. 4 is a graph conceptually showing time-dependent changes in die shear strength and effective vibration-axial directional holding force during a bonding process executed by the bonding apparatus of the embodiment. In the graph, the varying die shear strength is compared with the corresponding effective vibration-axial directional holding force in order to help understand the embodiment. In a region 41, the vertical load alone is controlled. In subsequent regions 42, 43 and 44, the chuck force, the ultrasonic vibration frequency and the vibration amplitude are respectively added each as a control factor.

Although the functions of the individual control sections are added step by step in the embodiment, the embodiment is not limited to this particular case. For example, the use of only a single control section is one control mode the control management section performs, and stopping one control section during the process may also be considered as one of possible control modes. A change in control value, whether it is continuous or stepwise, does not substantially affect the embodiment.

It is to be noted however that at the final stage of the bonding process, it is advantageous to reduce the ultrasonic vibration amplitude and stop the ultrasonic vibration through a state where ultrasonic vibration can be absorbed with plastic deformation of the bonding portion 13 or 14. If the ultrasonic vibration amplitude of a level which cannot be coped with the plastic deformation of the bonding portion 13 or 14, shearing of metallic bonding in the bonding region 17 occurs. While this shearing is important in enlarging the metallic bonding surface, stopping ultrasonic vibration in the sheared state results in a reduction in the metallic bonded area of the bonding region 17, which may cause undesirable improper contacts.

The formation of a sheared surface of the metallic bonded region can be minimized by reducing the ultrasonic vibration amplitude and stopping the ultrasonic vibration through a state where ultrasonic vibration can be absorbed with plastic deformation of the bonding portion 13 or 14 at the final stage of the bonding process. This can significantly improve the bonding reliability of the bonding region 17, which is a remarkable effect on the purpose of improving both the reliability and productivity.

With regard to that one of the aforementioned works which has bumps at the bonding portions, the contact areas of the individual bumps can be made even by using a so-called stud bump at least one of whose distal ends has a protruding shape. This can stabilize the profile for increasing the die shear strength for each bonding process. As a result, the control range for the effective vibration-axial directional holding force is widened and the reliability of the control method that is given prior to the bonding process is improved. It is therefore possible to satisfy both the reliability and productivity in the bonding process at extremely high levels.

Further, it is advantageous to heat at least one of the bonding portions 13 and 14, even temporarily, during the bonding process in the bonding method of the embodiment. While metallic bonding is formed by the application of ultrasonic vibration in the bonding process, the forming mechanism is effective in growing the coagulation portion, i.e., easy plastic deformation of metal which is used in bonding is effective in increasing the bonding area in case of so-called junction growth. Heating at least one of the bonding portions 13 and 14 makes the plastic deformation easier to occur and therefore contributes to progressing the process and improving the productivity. Making the plastic deformation of the bonding portion 13 or 14 easier to occur by the application of heat means that the die shear strength can be decreased by heating. If heat is applied to at least one of the bonding portions 13 and 14 temporarily during the bonding process, desirably over the entire bonding process, the degree of freedom in controlling the vibration-axial directional holding force and the inertial force at the time of meeting the condition to suppress the occurrence of sliding friction at the tool/chip contact surface 18 is increased, resulting in a higher control reliability.

Because the bonding method of the embodiment takes a substantial and systematic measure to prevent the wear-out of the mount tool 11, the method involves fewer restriction items to the semiconductor chip 12 and another part 15, e.g., the designation of the material for the contact surface with the mount work. This is the effect of removing the frictional coefficient and the mass from the control factors in the embodiment. The invention can therefore cope with bonding of combinations of various kinds of parts. The following are some of the specific combinations selectable.

(1) A tool contact work is a semiconductor chip having, as a bonding portion, a bump whose top surface is essentially consists of gold or copper, and an opposing work is a circuit board having a gold pad as a bonding portion.

(2) A tool contact work is a semiconductor chip having, as a bonding portion, a pad whose top surface is essentially consists of gold, aluminum or copper, and an opposing work is a circuit board having, as a bonding portion, a bump whose top surface is essentially consists of gold or copper.

(3) A tool contact work is a semiconductor chip having, as a bonding portion, a pad whose top surface is essentially consists of gold, aluminum or copper, and an opposing work is a semiconductor chip having, as a bonding portion, a bump whose top surface is essentially consists of gold or copper.

(4) A tool contact work is a semiconductor chip having, as a bonding portion, a bump whose top surface is essentially consists of gold, aluminum or copper, and an opposing work is a semiconductor chip having, as a bonding portion, a pad whose top surface is essentially consists of gold or copper.

(5) A tool contact work is a semiconductor chip having, as a bonding portion, a bump whose top surface is essentially consists of gold or copper, and an opposing work is a semiconductor chip having, as a bonding portion, a bump whose top surface is also essentially consists of gold or copper.

A second embodiment of the present invention will be described next with reference to the accompanying drawings. The embodiment is to be considered as illustrative and not restrictive.

Figure 5:
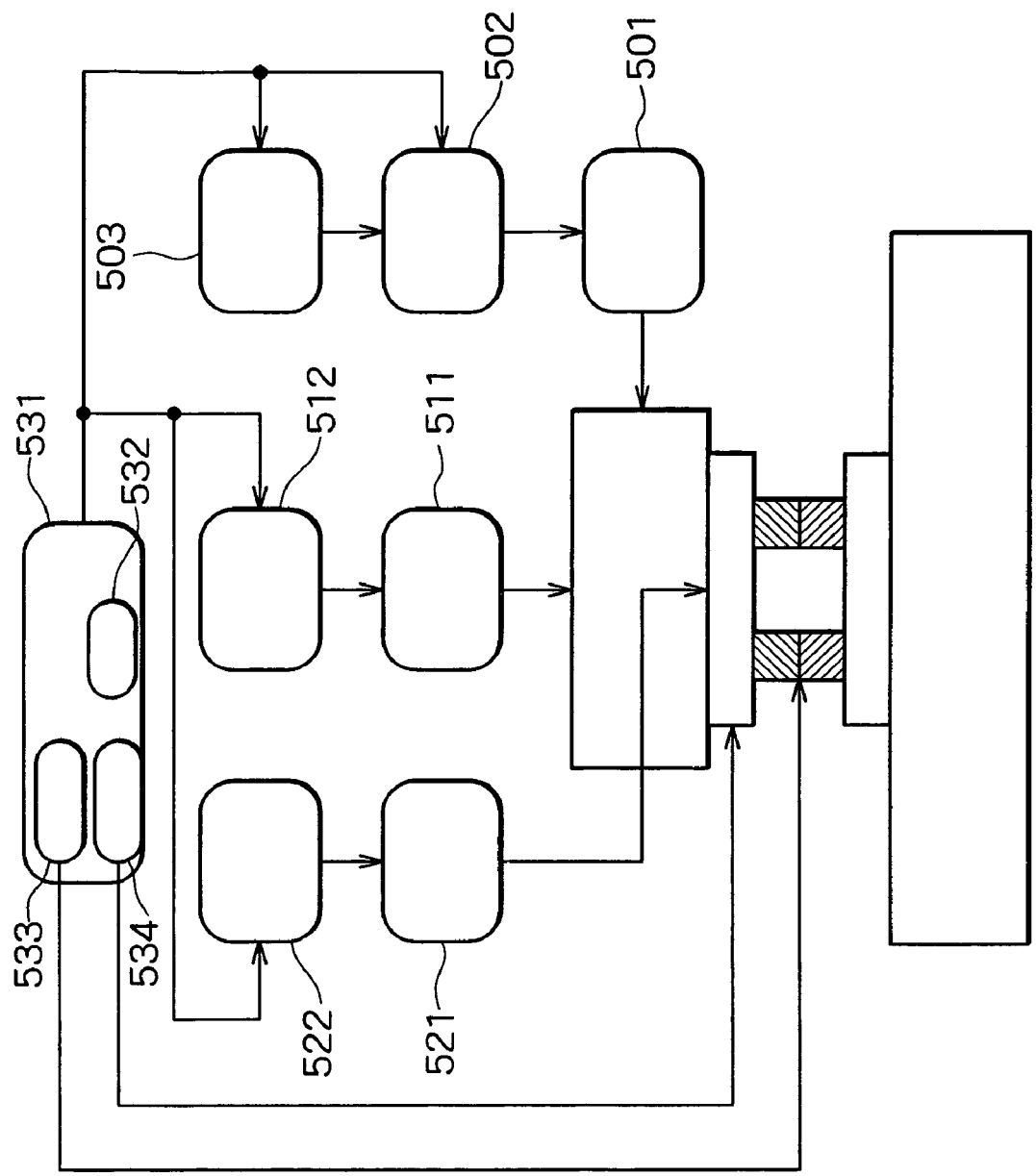
FIG. 5 is a conceptual diagram of a bonding apparatus according to another embodiment of the invention.

FIG. 5 is a conceptual diagram of a bonding apparatus according to this embodiment of the invention. The bonding apparatus, like the one shown in FIG. 3, has the basic structure of the ultrasonic bonding method and has a plurality of control sections, the control management section (531) and the memory device (532). In this embodiment, however, a die shear strength measuring section 533 which measures the die shear strength or its substitute characteristic thereof and a holding force measuring section 534 which measures the vibration-axial directional holding force or its substitute characteristic thereof are included in the control management section 531. The use of the measuring sections can provide information about real data for each bonding process.

In the embodiment, the control management section 531 performs control by using at least one the die shear strength measuring section 533 and the holding force measuring section 534 to acquire information on the real die shear strength or vibration-axial directional holding force during bonding and comparing this information with information on old bonding processes obtained from the memory device 532, as needed.

As apparent from the above, the effect of obtaining real information during a bonding process can allow the adequate control to be executed with a high precision even with respect to a contingent rapid change in die shear strength or a contingent rapid change in vibration-axial directional holding force. This can increase the control reliability at the time the condition for suppressing the occurrence of sliding friction at the tool/chip contact surface is maintained.

In short, according to the invention, the state where the effective vibration-axial directional holding force is greater than the die shear strength is maintained during bonding by the use of the apparatus having a mechanism to control the effective vibration-axial directional holding force in association with the die shear strength, so that the occurrence of sliding friction at the interface between the mount tool and a semiconductor chip to be held by the mount tool can be suppressed, thereby preventing wearing of the surface of the mount tool.

What is claimed is:

1. A bonding method for a semiconductor chip, comprising the steps of:

applying an ultrasonic vibration to a contact region where a bonding portion of said semiconductor chip is in contact with a bonding portion of another part to be bonded to said semiconductor chip, via a mount tool for holding said semiconductor chip; and controlling vibration-axial directional holding force, which is a shear strength of an entire contact interface of said semiconductor chip to be held by said mount tool and said mount tool in an ultrasonic-vibration-axial direction, and inertial force in said ultrasonic-vibration-axial direction, which is generated on said semiconductor chip to be held by said mount tool by said ultrasonic vibration, thereby maintaining a relationship of (vibration-axial directional holding force)>(die shear strength)+(inertial force).

2. The bonding method according to claim 1, further including the step of reducing said ultrasonic vibration to such an amplitude that immediately before stopping said ultrasonic vibration, said ultrasonic vibration can be absorbed with plastic deformation of at least one of said bonding portions of those two parts which are to be bonded.

3. The bonding method according to claim 1, further including the steps of:

designing a structure of at least one of said bonding portions of those two parts which are to be bonded into a so-called stud bump whose distal end has a protruding shape;

making said bonding portions of said two parts to be bonded contact with each other; and causing plastic deformation of at least one of projections at distal ends of said stud bump to thereby increase an area of contact.

4. The bonding method according to claim 1, wherein at least one of said bonding portions of those two parts which are to be bonded is heated in at least a part, and desirably all, of a time over which said ultrasonic vibration is applied.

5. The bonding method according to claim 1, wherein the structure of said bonding portion of said semiconductor chip to be held by said mount tool is a bump having at least one of gold, aluminum and copper as a material for a topmost surface, and said part to be bonded to said semiconductor chip is a wiring board which has a pad having at least one of gold, aluminum and copper as a material for a topmost surface.

6. The bonding method according to claim 1, wherein the structure of said bonding portion of said semiconductor chip to be held by said mount tool is a pad having at least one of gold, aluminum and copper as a material for a topmost surface, and said part to be bonded to said semiconductor chip is a wiring board the structure of whose bonding portion has at least one of gold, aluminum and copper as a material for a topmost surface.

7. The bonding method according to claim 1, wherein the structure of said bonding portion of said semiconductor chip to be held by said mount tool is a pad having at least one of gold, aluminum and copper as a material for a topmost surface, and said part to be bonded to said semiconductor chip is another semiconductor chip which has a bump having at least one of gold, aluminum and copper as a material for a topmost surface, or a part including said another semiconductor chip as a structural element.

8. The bonding method according to claim 1, wherein the structure of said bonding portion of said semiconductor chip to be held by said mount tool is a bump having at least one of gold, aluminum and copper as a material for a topmost surface, and said part to be bonded to said semiconductor chip is another semiconductor chip which has a pad having at least one of gold, aluminum and copper as a material for a topmost surface, or a part including said another semiconductor chip as a structural element.

9. The bonding method according to claim 1, wherein the structure of said bonding portion of said semiconductor chip to be held by said mount tool is a bump having at least one of gold, aluminum and copper as a material for a topmost surface, and said another part to be bonded to said semiconductor chip is another semiconductor chip which has a bump having at least one of gold, aluminum and copper as a material for a topmost surface, or a part including said another semiconductor chip as a structural element.

* * * * *